(12) United States Patent
Mellor et al.

(10) Patent No.: US 9,876,315 B2
(45) Date of Patent: Jan. 23, 2018

(54) ELECTRICAL COUPLING UNIT

(71) Applicant: ROLLS-ROYCE PLC, London (GB)

(72) Inventors: Richard Edward Mellor, Birmingham (GB); Redland Sanders, Birmingham (GB)

(73) Assignee: ROLLS-ROYCE plc, London (GB)

(*) Notice: Subject to any disclaimer, the term of this patent is extended or adjusted under 35 U.S.C. 154(b) by 187 days.

(21) Appl. No.: 15/075,514

(22) Filed: Mar. 21, 2016

(65) Prior Publication Data

US 2016/0285201 A1 Sep. 29, 2016

(30) Foreign Application Priority Data

Mar. 23, 2015 (GB) .................................. 1504860.6

(51) Int. Cl.
*G01R 31/00* (2006.01)
*H01R 13/213* (2006.01)
(Continued)

(52) U.S. Cl.
CPC ........... *H01R 13/631* (2013.01); *B64D 31/00* (2013.01); *G01R 31/008* (2013.01);
(Continued)

(58) Field of Classification Search
CPC ............... H01R 13/631; H01R 13/629; H01R 13/62905; H01R 13/635; H01R 13/64;
(Continued)

(56) References Cited

U.S. PATENT DOCUMENTS 3,609,632 A * 9/1971 Vetter .................. H01R 13/623
439/258
4,162,816 A * 7/1979 Malsot .................. H01R 13/64
439/246

(Continued)

FOREIGN PATENT DOCUMENTS

DE 3339650 A1 5/1985

*Primary Examiner* — Son Le
(74) *Attorney, Agent, or Firm* — Oliff PLC

(57) ABSTRACT

A coupling unit has an electrical-connector for push-fit electrical connection in the coupling unit axial direction to a mating electrical-connector of a unit. The electrical-connector and mating electrical-connector have engagement formations permitting push-fit connection only when the electrical-connector is in predetermined rotational alignment about axial direction with the mating electrical-connector. The coupling unit has a backshell in fixed rotational relationship with the electrical-connector and extending rearwardly therefrom to house, in use, one or more leads extending rearwardly from the electrical-connector. The coupling unit has coaxial actuation sleeve surrounding the backshell. The actuation sleeve axially moves to effect push-fit connection. The backshell and actuation sleeve are operatively connected so: actuation sleeve movement in forward axial direction towards the unit is resisted by electrical-connector contact with the mating electrical-connector to produce backshell rotation, thereby aligning the electrical-connector with the mating electrical-connector and allowing push-fit connection of the electrical-connector to the mating electrical-connector.

14 Claims, 7 Drawing Sheets

(51) Int. Cl.
*H01R 13/631* (2006.01)
*H01R 13/629* (2006.01)
*B64D 31/00* (2006.01)
*H01R 13/635* (2006.01)

(52) U.S. Cl.
CPC ..... *H01R 13/62905* (2013.01); *H01R 13/635* (2013.01); *H01R 2201/20* (2013.01)

(58) Field of Classification Search
CPC ............ H01R 2201/20; H01R 13/5224; H01R 29/00; H01R 13/213; H01R 13/625; H01R 39/00; H01R 4/5008; H01R 12/7058; H01R 24/005; H01R 33/46; H01R 33/9456; G01R 31/00; G01R 31/008; G01R 1/04; B64D 31/00
See application file for complete search history.

(56) References Cited

U.S. PATENT DOCUMENTS

| | | | |
|---|---|---|---|
| 4,239,325 A | 12/1980 | Tyson | |
| 4,468,019 A | 8/1984 | Staudenmaier | |
| 4,667,743 A | 5/1987 | Ringgenberg et al. | |
| 5,417,459 A | 5/1995 | Gray et al. | |
| 6,305,963 B1 * | 10/2001 | Felps | H01R 13/08 439/314 |
| 6,783,310 B2 | 8/2004 | Kohlert et al. | |
| 2007/0178717 A1 | 8/2007 | Harshman et al. | |
| 2014/0273582 A1 * | 9/2014 | Arcykiewicz | H01R 13/62 439/312 |

* cited by examiner

ELECTRICAL COUPLING UNIT

FIELD OF THE INVENTION

The present invention relates to an electrical coupling unit.

BACKGROUND

Modern aircraft electronic engine controllers (EECs) perform complex control and monitoring functions. They are important components of full authority digital engine control (FADEC) systems.

It is standard practice for a passing off test to be performed on every EEC. Such a test involves electronically testing the EEC while it is subjected to environmental conditions (e.g. representative temperature, pressure, humidity, vibration etc.) simulating an operational flight cycle.

Conveniently, such passing off tests are performed using a standard apparatus, shown schematically in FIG. 1. The apparatus includes: an environmental test chamber 1 in which the EEC 2 being tested is located, a harnessed bundle of flexible cables 3 passing through a wall of the chamber, and a testing control unit 4 which electronically tests the EEC. The cables are joined at one end to an array of connectors on the EEC and at the other end to the control unit.

With such an apparatus, the cables have to be manually disconnected and reconnected for every change of EEC. The connection process can become increasingly problematic as each connection is made and the space surrounding the EEC connectors reduces. Similarly, the disconnection of particularly the first few cables from the EEC can be problematic. Tools used to aid these processes can result in damage to the EEC.

It would be desirable to provide an electrical coupling unit which can facilitate reliable, secure and automated connection/disconnection of such cables.

SUMMARY

In a first aspect, the present invention provides an electrical coupling unit having:
  an electrical connector for push-fit electrical connection in an axial direction of the coupling unit to a mating electrical connector of a receiving unit, the electrical connector and the mating electrical connector having respective engagement formations which permit the push-fit connection only when the electrical connector is in a predetermined rotational alignment about the axial direction with the mating electrical connector;
  a backshell in a fixed rotational relationship with the electrical connector and extending rearwardly therefrom to house, in use, one or more electrical leads extending rearwardly from the electrical connector; and
  a coaxial actuation sleeve surrounding the backshell, the actuation sleeve being axially movable to effect the push-fit connection;
  wherein the backshell and the actuation sleeve are operatively connected such that: movement of the actuation sleeve in a forward axial direction towards the receiving unit is resisted by contact of the electrical connector with the mating electrical connector to produce rotation of the backshell, thereby rotationally aligning the electrical connector with the mating electrical connector and allowing push-fit electrical connection of the electrical connector to the mating electrical connector.

By requiring that the electrical connectors are rotated into alignment before the push-fit connection is made, the coupling unit can assure a low connection failure rate. Moreover, actuating the rotational alignment via axial movement of the actuation sleeve enables a simple connection process that can be readily automated so that e.g. plural parallel coupling units can be deployed simultaneously. In addition, the coupling unit helps to avoid damage to the receiving unit, particularly in an automated coupling environment. Also, the coupling unit can be rapidly reconfigured for mounting to different platforms which have e.g. different numbers and spatial patterns of coupling units.

In a second aspect, the present invention provides a test apparatus for repeated connection and disconnection of electrical connectors, the test apparatus having:
  a first mounting platform;
  an array of coupling units according to the first aspect mounted via their respective actuation sleeves to the first mounting platform;
  electrical leads extending rearwardly from the electrical connectors of the coupling units;
  a second mounting platform for mounting a receiving unit having mating electrical connectors to be push-fit connected to the electrical connectors of the coupling units; and
  a drive arrangement controllable to move the first mounting platform in the axial directions of the coupling units.

The test apparatus may further have a control unit which controls the drive arrangement, receives the electrical leads, and is adapted to electrically test thereby the receiving unit.

The test apparatus may further have an environmental test chamber in which the receiving unit is located when mounted to the second mounting platform, the test chamber controlling one or more parameters selected from the group consisting of: the temperature within the chamber, the humidity within the chamber, the air pressure within the chamber, and mechanical vibration applied to the receiving unit.

In a third aspect, the present invention provides use of the test apparatus of the second aspect for testing an engine electronic controller as the receiving unit. For example, the testing can be under operational conditions simulated by the test chamber. In this way, pass off testing can be performed on engine electronic controllers.

Optional features of the invention will now be set out. These are applicable singly or in any combination with any aspect of the invention.

The receiving unit can be an engine electronic controller, e.g. an aircraft engine electronic controller.

The electrical connector and the mating electrical connector can have circular transverse cross-sections.

The electrical connector can be one of a male plug or a female receptacle, and the mating electrical connector can be the other of a male plug or a female receptacle.

The electrical connector can contain an array of male electrical prongs or an array of female electrical sockets, and the mating electrical connector can contain the other of a corresponding array of male electrical prongs and a corresponding array of female electrical sockets. In this case, the respective engagement formations can comprise the arrays of prongs or sockets.

However, another option is for the engagement formation of the electrical connector to comprise a key or keyway, and the engagement formation of the mating electrical connector to comprise the other of a key or keyway. By separating the engagement formation functionality from the electrical connection functionality, damage to the electrical connection can be avoided.

In general, it can be preferable for the engagement formation to be separate and distinct from the parts of the connectors which make the actual electrical connection (e.g. the prongs or sockets), as those parts can then be protected from damage that might otherwise occur during the rotation and counter-rotation.

Conveniently, the backshell and the actuation sleeve may be operatively connected by one or more cam formations which, on contact of the electrical connector with the mating electrical connector, convert forward axial movement of the actuation sleeve into the rotation of the backshell. Advantageously, by connecting the backshell and the actuation sleeve in this way, it is possible to avoid having the predetermined rotational alignment produced by a camming action applied between the electrical connector and the mating electrical connector. The electrical connector and mating electrical connector thus do not need special modification (which can be problematic from a space envelope perspective, and may in any event be unnecessary when the receiving unit is in actual use rather than in a testing environment). Further, camming forces which could distort or damage the electrical connector or mating electrical connector do not need to be applied through these connectors. For example, the electrical coupling unit may have plural such cam formations circumferentially distributed around the unit.

The, or each, cam formation may comprise a cam follower provided by one of the backshell and the actuation sleeve, and a first cam surface provided by the other of the backshell and the actuation sleeve along which the cam follower moves, the first cam surface being angled such that the backshell moves axially rearwardly relative to the actuation sleeve as the backshell rotates. Conveniently, the backshell can provide the cam follower and the actuation sleeve can provide the first angled cam surface. For example, the cam follower can be a radially extending pin, and a side of a slot or opening in the actuation sleeve can form the first angled cam surface.

The, or each, cam formation may further comprise an alternative second angled cam surface which, on contact of the electrical connector with the mating electrical connector, converts forward axial movement of the actuation sleeve into the rotation of the backshell but in the opposite rotational direction. The cam follower can then be selectably positioned at either the first or the second cam surface to select the direction of rotation of the backshell. For example, the first and second cam surfaces can form the two sides of a V-shape. The cam follower can be biased towards one of the first or the second cam surfaces. In this way active selection of the position of the cam follower can be avoided. For example, the biasing can be achieved by introducing a torsional pre-tension to the electrical leads which, in use, extend rearwardly from the electrical connector.

The backshell and the actuation sleeve may be operatively connected by a first spring formation which is loaded by a rearward axial movement of the backshell relative to the actuation sleeve to cushion the contact of the electrical connector with the mating electrical connector sleeve. For example, the first spring formation may be a wave spring coaxial to the coupling unit.

The, or each, cam formation may further comprise an opposing angled cam surface to the first angled cam surface which, on movement of the actuation sleeve in a rearward axial direction breaking the push-fit electrical connection of the electrical connector to the mating electrical connector, converts forward axial movement of the backshell relative to the actuation sleeve into rotation of the backshell in the opposite rotational direction. For example, when the coupling unit has the first spring formation, the power to drive the relative forward axial movement of the backshell can be provided by unloading of the first spring formation.

The actual push-fitting of the electrical connector to the mating electrical connector can be made by further movement of the actuation sleeve in the forward axial direction. According to another option, however, on rotational alignment of the electrical connectors, the first spring formation can unload to perform the push-fitting. Indeed, the push-fitting can be performed partly by further movement of the actuation sleeve in the forward axial direction and partly by unloading of the first spring formation.

The electrical coupling unit may further have a coaxial hood surrounding the electrical connector, wherein the hood engages the mating electrical connector on forward axial movement of the actuation sleeve to axially align the electrical connector with the mating electrical connector before contact of the electrical connector with the mating electrical connector. The hood may be spring mounted on the actuation sleeve by a second spring formation which cushions the engagement of the hood with the mating electrical connector. For example, the second spring formation may be a wave spring coaxial to the coupling unit.

The backshell and the actuation sleeve may further have respective abutment formations which abut at a predetermined relative axial position of the backshell and the actuation sleeve to prevent the backshell moving axially forwardly relative to the actuation sleeve beyond the predetermined position. The formations can prevent the backshell and the electrical connector from being left behind when the actuation sleeve is moved in a rearward axial direction away from the receiving unit to break the push-fit electrical connection of the electrical connector and the mating electrical connector.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
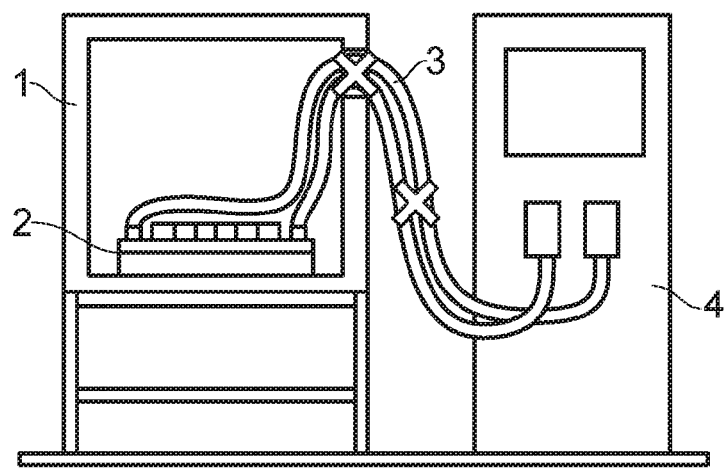
FIG. 1 shows schematically an apparatus for performing a passing off test on an electronic engine controller.
Figure 2:
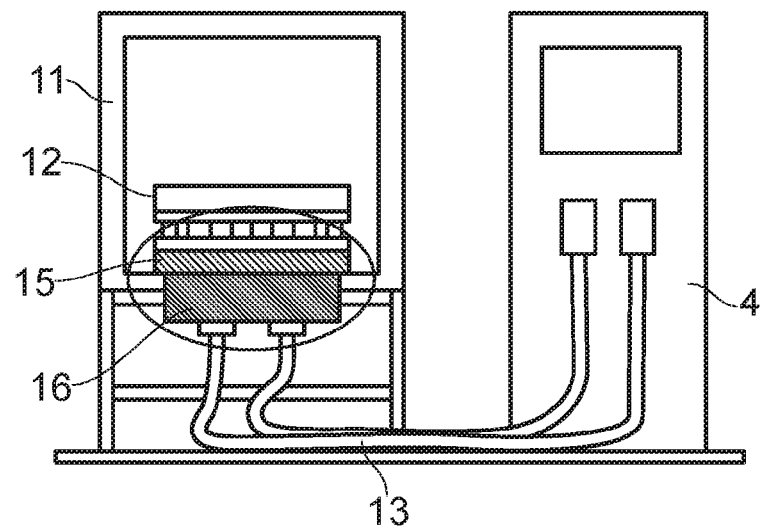
FIG. 2 shows schematically an apparatus according to the present invention for performing a passing off test on an electronic engine controller.

FIG. 2 shows schematically an apparatus according to the present invention for performing a passing off test on an EEC. The apparatus includes: an environmental test chamber 11 in which the EEC 12 being tested is located, a bundle of flexible cables 13 joined at one end to an array of connectors on the EEC and at the other end to a testing control unit 14 which electronically tests the EEC.

The apparatus further includes an array of coupling units which are mounted to a mounting platform 15, and a drive arrangement 16 which is controllable by the testing control unit 14 to move the mounting platform in the axial directions of the coupling units for repeated push-fit connection and disconnection of electrical connectors of the coupling units with mating electrical connectors of the EEC 12.

The mounting platform 15 and the drive arrangement 16 are described in more detail below, but first we describe details of the coupling units.

Figure 3:
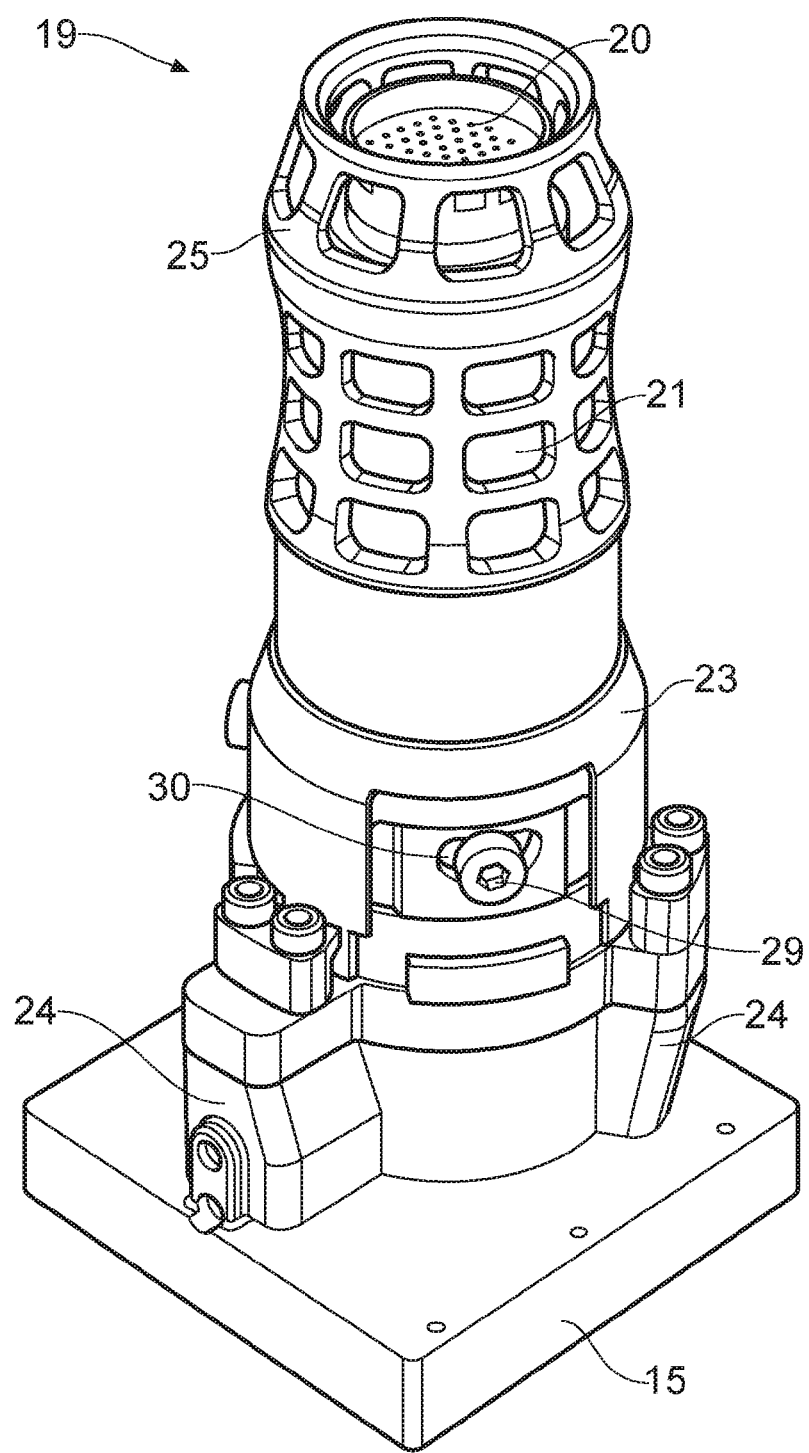
FIG. 3 shows a perspective view of one of a coupling unit.
Figure 4:
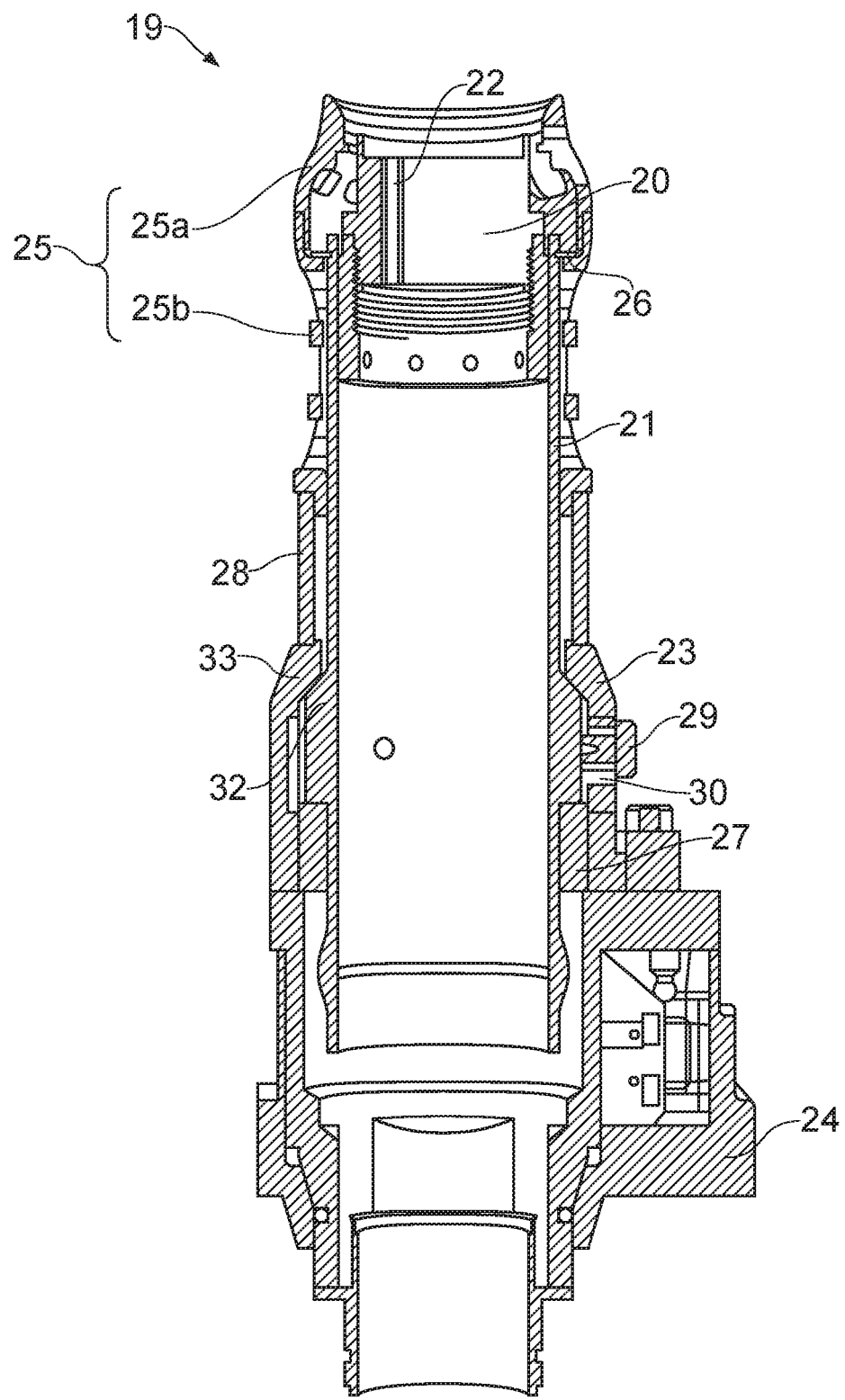
FIG. 4 shows a longitudinal cross-sectional view of one of the coupling unit.
Figure 5:
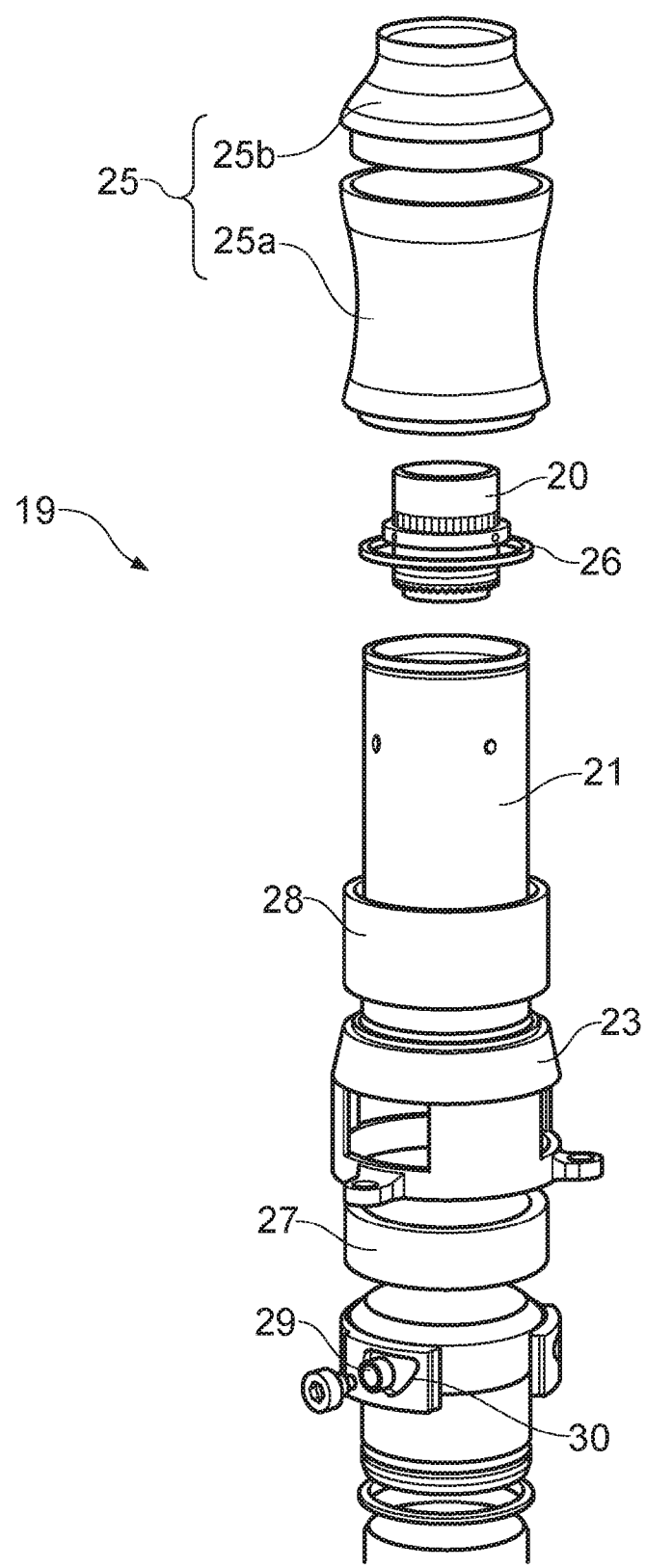
FIG. 5 shows an exploded view of one of the coupling unit.

FIGS. 3 to 5 show respectively perspective, longitudinal cross-sectional and exploded views of one of the coupling units.

The coupling unit 19 has a cylindrical electrical connector 20 for push-fit electrical connection in a forward axial direction of the unit to a mating cylindrical electrical connector of the EEC 12. The electrical connector 20 contains an array of electrical prongs or sockets, while the mating electrical connector contains a corresponding array of sockets or prongs.

Electrical leads (not shown in FIGS. 3 to 5) extend rearwardly from the electrical connector 20 through a cylindrical backshell 21 of the coupling unit to join the bundle of flexible cables 13. The backshell is in a fixed rotational relationship with the electrical connector 20.

The electrical connector 20 has a key or keyway 22 formed in a wall thereof which fits to a corresponding keyway or key of the mating electrical connector of the EEC 12 when the electrical connector 20 and the mating electrical connector are rotationally aligned. The push-fit connection of the connectors can only take place when this alignment is achieved.

The coupling unit 19 further has a coaxial actuation sleeve 23 surrounding the backshell 21. The actuation sleeve is axially movable by the drive arrangement 16 to effect the push-fit connection of the connectors. In particular, the actuation sleeve has mounting formations 24 by which the sleeve can be mounted to the platform 15.

The backshell 21 has an abutment formation in the form of a shoulder 32 which can engage with a corresponding abutment formation in the form of a narrowing 33 in the bore of the actuation sleeve 23 to prevent the backshell from being pulled forwardly out of the actuation sleeve.

A coaxial hood 25 surrounds the electrical connector 20. As best shown in FIGS. 4 and 5, the hood can be formed in two parts: a lower part 25a surrounds the bottom of the connector 20 and also an upper part of the backshell 21, while a top part 25b surrounds the top of the connector 20. The top part 25b alone can thus be easily replaced if worn. A circlip 26 attached to the backshell prevents the lower part 25a from sliding off the unit in a forward axial direction. The hood can have weight-saving apertures formed in it, as shown in FIGS. 3 and 4.

A first wave spring 27 is located between the backshell 21 and the actuation sleeve 23, and a second wave spring 28 is located between the actuation sleeve 23 and the coaxial hood 25. The first wave spring 27 typically has a spring force which is about four times that of the second wave spring 28.

The backshell 21 and the actuation sleeve 23 are also operatively connected by three circumferentially distributed cam formations. Each cam formation comprises a pin 29 which extends radially outwardly from the backshell and a triangular opening 30 formed in the actuation sleeve which provides V-shaped first 31a and second 31b angled cam surfaces, described below with reference to FIG. 6.

Advantageously, the lower section of the coupling unit shown in FIGS. 3 to 5 (i.e. from the backshell 21 and actuation sleeve 23 downwards) can be a generic subassembly able to carry a range of different upper sections (i.e. the electrical connector 20 and the hood 25) suitable for testing different EECs 12.

The coupling unit 19 is now further described with reference to FIGS. 6(a) to (e), which show schematically successive stages in a connecting and disconnecting operation.

Starting at FIG. 6(a), the unit is presented to a mating connector 20' of the EEC 12. The key or keyway 22 of the connector 20 is rotationally misaligned with the corresponding keyway or key 22' of the mating connector 20'. As explained below, when the unit is actuated by moving the actuation sleeve 23 axially forward to effect the push-fit connection, the connector 20 rotates in one direction or the other depending on whether the pin 29 of each cam formation is positioned at either its first 31a or its second 31b cam surface. Thus as part of an initial setting up, the backshell 21 is rotated in the actuation sleeve to position the pins 29 at the beginning of the desired cam surface. In FIG. 6(a) that cam surface is the first cam surface 31a. Another option, however, is to introduce at set up a torsional pre-tension to the electrical leads which, in use, extend rearwardly from the electrical connector 20 through the backshell 21 before joining the bundle of flexible cables 13. In this way, the backshell 21 can be biased to automatically rotate the pins 29 to the beginning of the desired cam surface.

As shown in FIG. 6(b), the actuation sleeve 23 is then moved axially forward, at this stage bringing the rest of the coupling unit forward with it. The coaxial hood 25 has a chamfered top part which engages the mating electrical connector 20' to axially align the electrical connector 20 with the mating electrical connector, although the keys and keyways 22, 22' remain rotationally misaligned. The second wave spring 28 cushions the engagement of the hood with the mating electrical connector. Compression of the second wave spring is indicated in FIG. 6(a) to (e) by progressively darker shading.

When the electrical connector 20 contacts the mating electrical connector 20', further forward axial movement of the actuation sleeve 23 is resisted by the misalignment of the key and keyway 22, 22', as show in FIG. 6(b). However, the cam formations then cause the backshell 21 to rotate in the actuation sleeve. More particularly, the pins 29 slide along the first cam surfaces 31a, rotating the backshell as it moves axially rearwardly relative to the actuation sleeve. Eventually the rotation brings the key and keyway 22, 22' into alignment, as shown in FIG. 6(c). The rotating contact of the connector 20, 20' is cushioned and resisted by the first wave spring 27. Compression of the first wave spring is also indicated in FIG. 6(a) to (e) by darker shading.

Alignment of the key and keyway 22, 22' also brings the electrical prongs and sockets of the connectors 20, 20' into alignment. However, the key and keyway arrangement prevents any load being applied to the prongs and sockets until that point.

Figure 6:
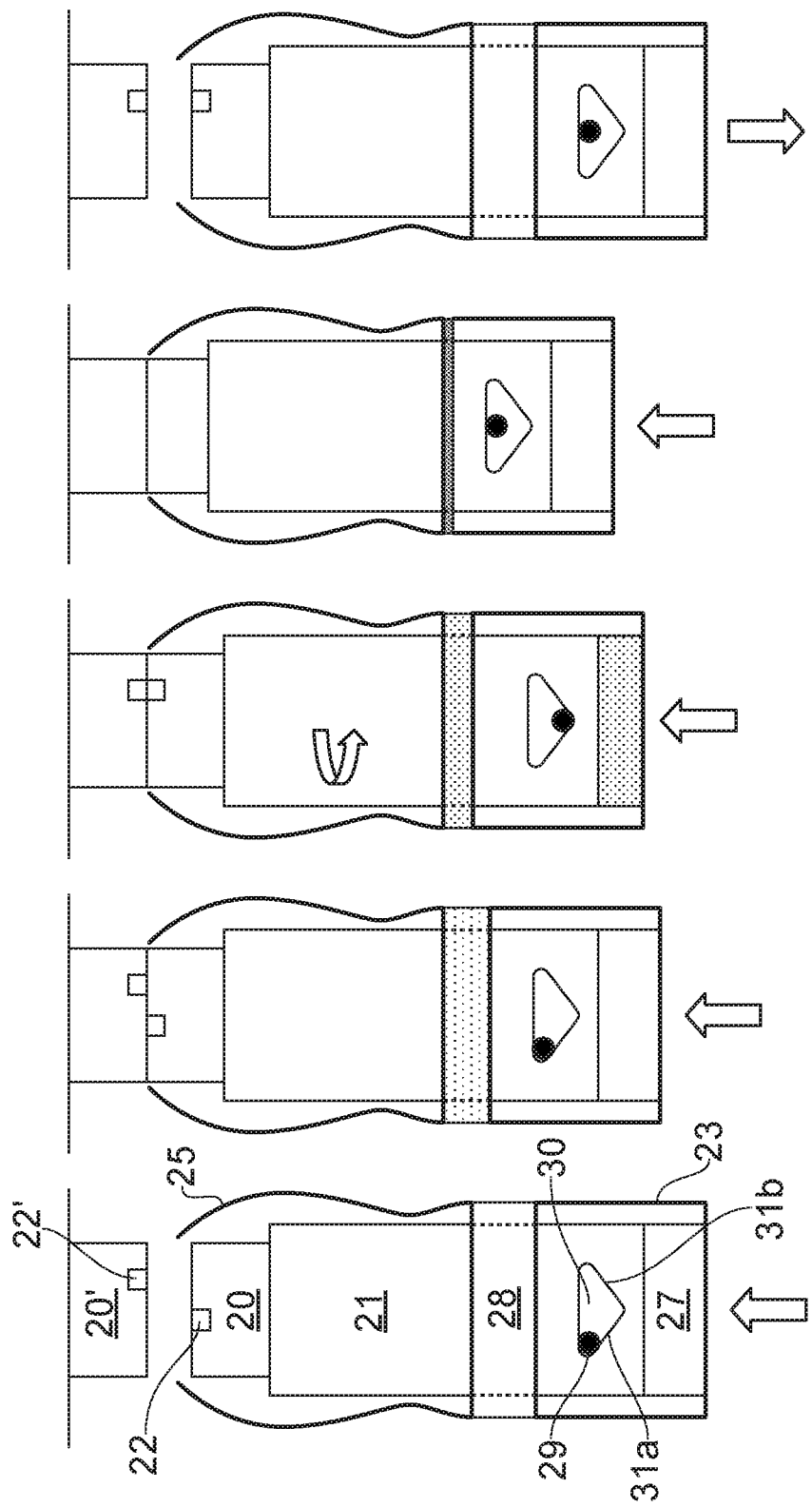
FIGS. 6(a), 6(b), 6(c), 6(d) and 6(e), collectively referred to herein as FIG. 6, show schematically successive stages in a connecting and disconnecting operation using the coupling unit.

With the connectors 20, 20' in alignment, the load on first wave spring 27 releases resulting in the connectors 20, 20' being push-fitted together, as shown in FIG. 6(*d*). A light force in the forward axial direction can be maintained on the actuation sleeve 23, however, to ensure the push-fit is maintained, e.g. against the opposing force exerted by the second wave spring 28. This force can cause some partial re-compression of the first wave spring 27.

To disconnect the connectors 20, 20', the actuation sleeve 23 is simply moved in the rearward axial direction, as shown in FIG. 6(*e*). The shoulder 32 of the backshell 21 engages with the narrowing 33 in the bore of the actuation sleeve to prevent the backshell and the connector 20 being left behind by this rearward movement. The second wave spring 28 unloads as the hood 25 disengages from the mating electrical connector 20'.

The coupling unit is then ready to be presented to a mating connector of another EEC, the backshell 21 having first to be rotated in the actuation sleeve 23 to re-position the pins 29 at the beginning of the desired cam surface 31*a*, 31*b*.

The overall length of such a coupling unit may be in the range from 150 to 300 mm, and the diameter may be in the range from 40 to 80 mm. A forward axial movement of the actuation sleeve 23 producing a compression of about 12 mm in the first wave spring 27 can generate an approximately 10° total rotation of the backshell 21 and the connector 20. This can assure alignment of the key and keyways 22, 22' and enables reliable and simply actuatable connection of plural such coupling units to respective mating connectors of the EEC 12. In a typical unit, the hood 25 can provide about 2 mm of mismatch tolerance between the connectors 20, 20' transversely to the axial direction of the unit. The first wave spring 27 may have a spring in the range from 3.5 to 5.5 N/mm, and the second wave spring 28 may have a spring in the range from 1.0 to 1.25 N/mm.

Conveniently a majority of the non-electrically conducting components of the coupling unit can be formed by additive layer manufacturing (e.g. 3D printing). This allows the unit to be formed largely out of plastic, such as polyetherimide, which can reduce weight while providing adequate thermal shielding of the internal unit components from high temperature in the test chamber 11. Advantageously, the coupling unit can be deployed at any angular orientation, and can incorporate a wide variety of connector types.

As shown in FIG. 6(*e*), when the actuation sleeve 23 is moved in the rearward axial direction to disconnect the connectors 20, 20', the pins 29 remain in a neutral position between the start positions of the two cam surface 31*a*, 31*b*. Another option, however, is to provide the cam formations with, instead of the triangular openings 30, slot-shaped openings 30', as shown schematically in FIGS. 7(*a*) to (*e*), which show schematically successive stages in a connecting and disconnecting operation using such a variant of the coupling unit.

Figure 7:
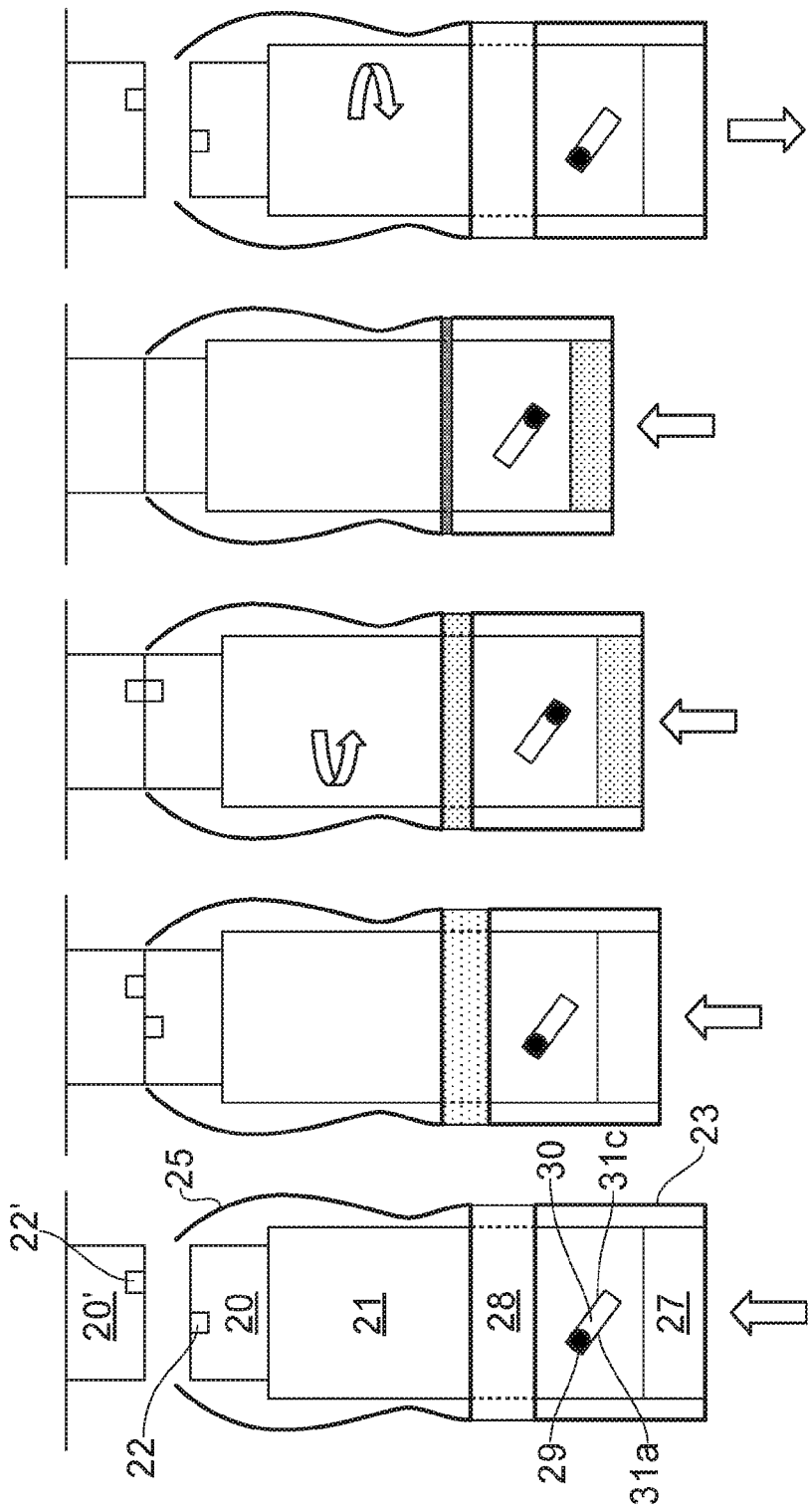
FIGS. 7(a), 7(b), 7(c), 7(d) and 7(e), collectively referred to herein as FIG. 7, show schematically successive stages in a connecting and disconnecting operation using a variant of the coupling unit.

Each slot-shaped opening 30' provides only one cam surface 31*a* for rotating the backshell 21 and bringing the key and keyway 22, 22' into alignment. Thus only one rotation direction is possible on connection. On the other hand, each slot-shaped opening 30' has an opposing cam surface 31*c* for counter-rotating the backshell on disconnection. More particularly, the stages of connection shown in FIGS. 7(*a*) to (*c*) match those shown in FIGS. 6(*a*) to (*c*). However, once the key and keyway 22, 22' are aligned, as shown in FIG. 7(*d*), the load on first wave spring 27 cannot release as the pins 29 abut the opposing cam surfaces 31*c*, which stops the backshell moving axially forwardly relative to the actuation sleeve 23. Accordingly, the connectors 20, 20' are push-fitted together by continued forward movement of the actuation sleeve. However, as shown in FIG. 7(*e*), after disconnection of the connectors 20, 20' causing disengagement of the key and keyway 22, 22', the connector 20 and backshell 21 become free to rotate. The first wave spring 27 thus unloads forcing the pins 29 to slide along the opposing cam surfaces 31*c* and counter-rotating the connector 20 and backshell 21 back to their start position. Thus advantageously, there is no need to re-position the pins 29 on presentation of the coupling unit to a mating connector of another EEC.

Figure 8:
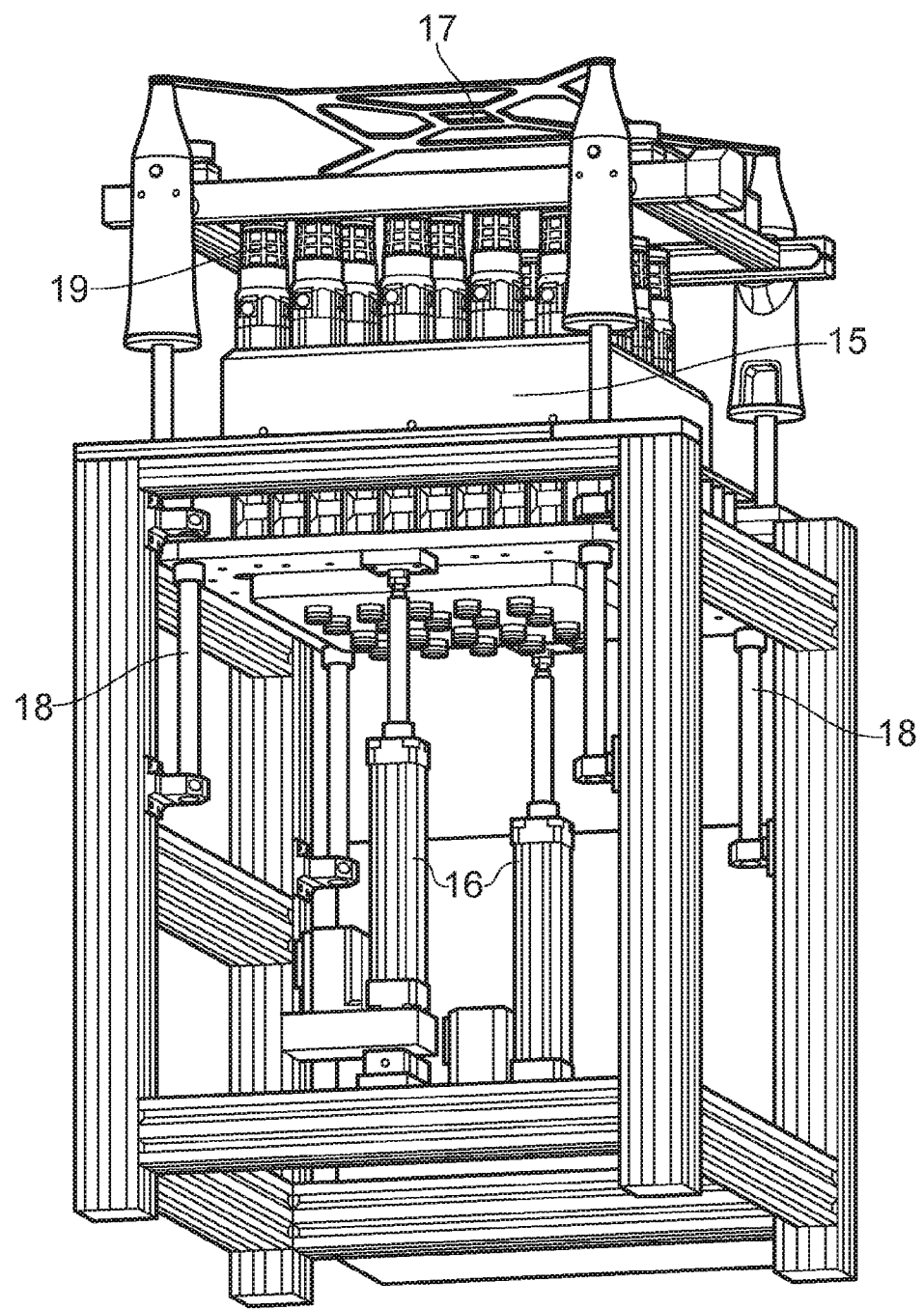
FIG. 8 shows schematically mounting and drive arrangements for an array of the coupling units.

FIG. 8 shows schematically the mounting and drive arrangements for an array of the coupling units 19. The units are securely mounted to a platform 15 with the connectors facing upwards, and the EEC is mounted to a facing platform 17 with its mating connectors facing downwards. The two platforms are held in a rigid frame at the underside of the environmental test chamber (not shown in FIG. 8), the frame incorporating a number of slides 18 allowing the mounting platform 15 to move up and down relative to the EEC platform 17. The drive arrangement 16 in the form of hydraulically or electrically operated pistons controlled by the testing control unit 14 moves the mounting platform 15 up and down and thus cause the repeated push-fit connection and disconnection of the electrical connectors of the coupling units and the mating electrical connectors of the EEC, with force being applied to the coupling units 19 only in the direction parallel to the axes of the units. When the pistons have moved a certain distance upwards, the connectors become fully engaged and the passing off test is run. As the pistons are generally not at the upwards limit of their travel at this position, they can be used to maintain a clamping force on the connectors during the test. After the test is completed, the testing control unit 14 commands the pistons to drive the mounting platform 15 downwards and the connectors are disengaged.

The coupling units 19 are an important contributor to reducing the likelihood of damage to the EEC, its mating connectors and the flexible cables 13. They also promote testing automation, particularly if coupled with a transport system which could, without operator intervention, automatically connect the EEC to a series of test stations and/or automatically connect a series of EECs to a given test station. In such a system, an EEC which failed a test could be automatically rejected to a holding location, making room for a next EEC to be tested.

The coupling units 19, being modular in nature, are also compatible with the testing of different types of EEC. In particular, units can be rapidly repurposed for use on a different mounting platform 15 requiring a different number and or different spatial pattern of units.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical coupling unit having:
    an electrical connector for push-fit electrical connection in an axial direction of the coupling unit to a mating electrical connector of a receiving unit, the electrical connector and the mating electrical connector having respective engagement formations which permit the push-fit connection only when the electrical connector is in a predetermined rotational alignment about the axial direction with the mating electrical connector;

a backshell in a fixed rotational relationship with the electrical connector and extending rearwardly therefrom to house, in use, one or more electrical leads extending rearwardly from the electrical connector; and a coaxial actuation sleeve surrounding the backshell, the actuation sleeve being axially movable to effect the push-fit connection;

wherein the backshell and the actuation sleeve are operatively connected such that: movement of the actuation sleeve in a forward axial direction towards the receiving unit is resisted by contact of the electrical connector with the mating electrical connector to produce rotation of the backshell, thereby rotationally aligning the electrical connector with the mating electrical connector and allowing push-fit electrical connection of the electrical connector to the mating electrical connector; and wherein the backshell and the actuation sleeve are operatively connected by one or more cam formations which, on contact of the electrical connector with the mating electrical connector, convert forward axial movement of the actuation sleeve into the rotation of the backshell.

2. An electrical coupling unit according to claim 1, wherein the engagement formation of the electrical connector comprises a key or keyway, and the engagement formation of the mating electrical connector comprises the other of a key or keyway.

3. An electrical coupling unit according to claim 1, having plural cam formations circumferentially distributed around the unit.

4. An electrical coupling unit according to claim 1, wherein the, or each, cam formation comprises a cam follower provided by one of the backshell and the actuation sleeve, and a first cam surface provided by the other of the backshell and the actuation sleeve along which the cam follower moves, the first cam surface being angled such that the backshell moves axially rearwardly relative to the actuation sleeve as the backshell rotates.

5. An electrical coupling unit according to claim 4, wherein the, or each, cam formation further comprises an alternative second angled cam surface which, on contact of the electrical connector with the mating electrical connector, converts forward axial movement of the actuation sleeve into the rotation of the backshell but in the opposite rotational direction;

wherein the cam follower is selectably positionable at either the first or the second cam surface to select the direction of rotation of the backshell.

6. An electrical coupling unit according to claim 1, wherein the backshell and the actuation sleeve are operatively connected by a first spring formation which is loaded by a rearward axial movement of the backshell relative to the actuation sleeve to cushion the contact of the electrical connector with the mating electrical connector sleeve.

7. An electrical coupling unit according to claim 6, wherein the first spring formation is a wave spring coaxial to the coupling unit.

8. An electrical coupling unit according to claim 1 further having a coaxial hood surrounding the electrical connector, wherein the hood engages the mating electrical connector on forward axial movement of the actuation sleeve to axially align the electrical connector with the mating electrical connector before contact of the electrical connector with the mating electrical connector.

9. An electrical coupling unit according to claim 8, wherein the hood is spring mounted on the actuation sleeve by a second spring formation which cushions the engagement of the hood with the mating electrical connector.

10. An electrical coupling unit according to claim 9, wherein the second spring formation is a wave spring coaxial to the coupling unit.

11. A test apparatus for repeated connection and disconnection of electrical connectors, the test apparatus having:
    a first mounting platform;
    an array of coupling units according to claim 1 mounted via their respective actuation sleeves to the first mounting platform;
    electrical leads extending rearwardly from the electrical connectors of the coupling units;
    a second mounting platform for mounting a receiving unit having mating electrical connectors to be push-fit connected to the electrical connectors of the coupling units; and
    a drive arrangement controllable to move the first mounting platform in the axial directions of the coupling units.

12. A test apparatus according to claim 11 further having a control unit which controls the drive arrangement, receives the electrical leads, and is adapted to electrically test thereby the receiving unit.

13. A test apparatus according to claim 11, further having an environmental test chamber in which the receiving unit is located when mounted to the second mounting platform, the test chamber controlling one or more parameters selected from the group consisting of: the temperature within the chamber, the humidity within the chamber, the air pressure within the chamber, and mechanical vibration applied to the receiving unit.

14. A method of testing an engine electronic controller including:
    mounting the engine electronic controller to the second mounting platform of the test apparatus of claim 11;
    using the drive arrangement of the test apparatus to move the first mounting platform in the axial directions of the coupling units of the test apparatus to electrically connect electrical connectors of the coupling units to mating electrical connectors of the engine electronic controller; and
    testing the engine electronic controller using the test apparatus.

* * * * *